United States Patent [19]

Borras et al.

[11] Patent Number: 5,365,207
[45] Date of Patent: Nov. 15, 1994

[54] MULTI-BANDWIDTH SAW FILTER

[75] Inventors: Jaime A. Borras, Hialeah, Fla.; David Penunuri, Fountain Hills, Ariz.

[73] Assignee: Motorola, Inc., Schaumburg, Ill.

[21] Appl. No.: 999,256

[22] Filed: Dec. 31, 1992

[51] Int. Cl.[5] .............................................. H03H 9/64
[52] U.S. Cl. .................. 333/196; 310/313 R
[58] Field of Search .............. 333/193, 194, 195, 196; 310/313 R, 313 B, 313 C, 313 D

[56] References Cited

U.S. PATENT DOCUMENTS

| 3,750,027 | 7/1973 | Hartmann | 325/349 |
|---|---|---|---|
| 3,831,116 | 8/1974 | Davis, Jr. et al. | 333/72 |
| 3,855,556 | 12/1974 | Hartmann | 333/72 |
| 4,006,290 | 2/1977 | Momberger et al. | 358/196 |
| 4,087,714 | 5/1978 | LaRosa et al. | 310/313 |
| 4,207,545 | 6/1980 | Grudkowski et al. | 333/196 |
| 4,473,888 | 9/1984 | Smith | 364/821 |
| 4,491,811 | 1/1985 | Niitsuma et al. | 333/151 |
| 4,622,525 | 11/1986 | Brown | 333/151 |
| 4,745,378 | 5/1988 | Niitsuma et al. | 333/196 |

FOREIGN PATENT DOCUMENTS 0064255 5/1977 Japan .
0022745 2/1979 Japan .

Primary Examiner—Robert J. Pascal
Assistant Examiner—Darius Gambino
Attorney, Agent, or Firm—Andrew S. Fuller

[57] ABSTRACT

A multi-bandwidth SAW filter for an input signal is provided which includes an SAW transducer having a selectable length corresponding to the desired bandwidth of the filter. The SAW filter is responsive to a control signal which corresponds to a selectable bandwidth of the filter to present the input signal to an appropriately lengthed SAW transducer.

7 Claims, 4 Drawing Sheets

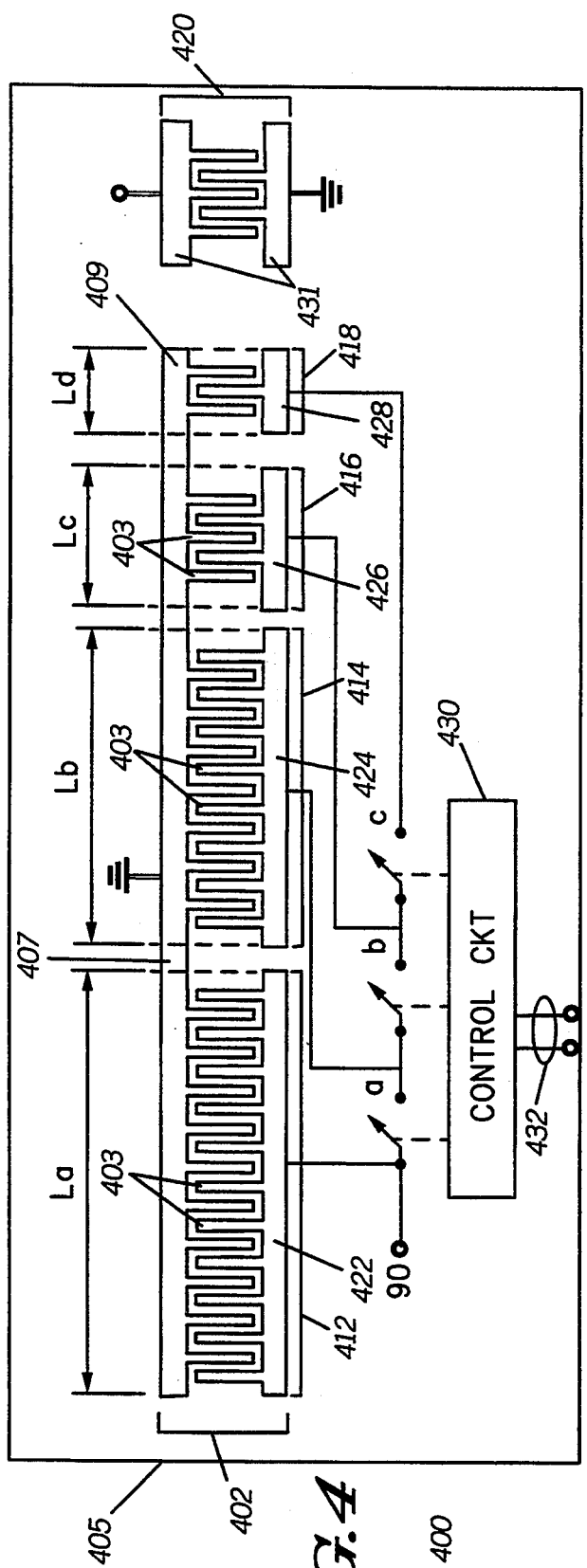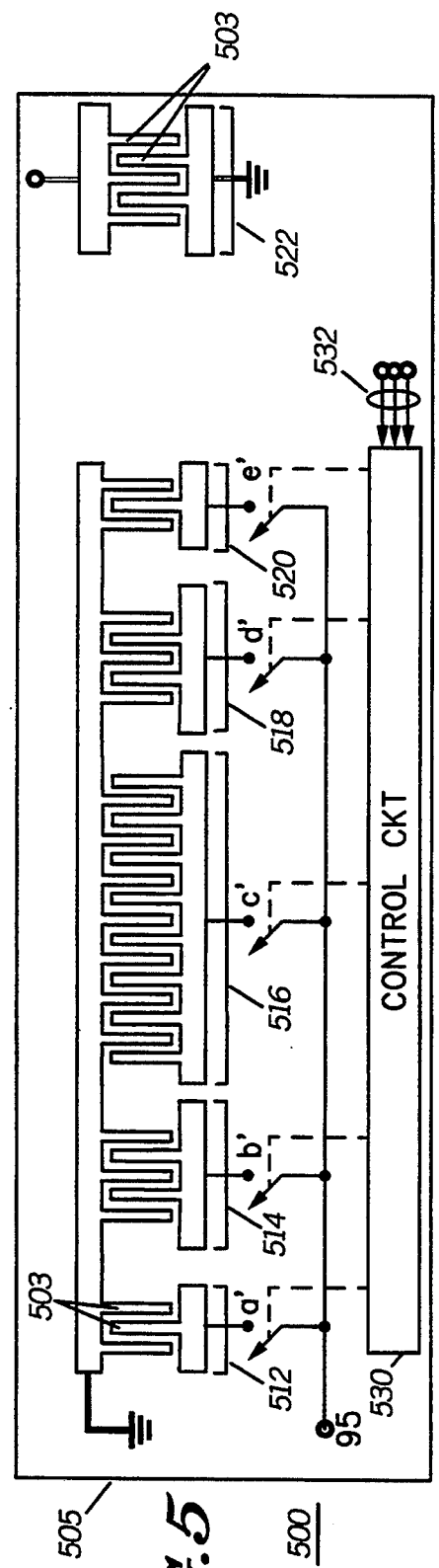

MULTI-BANDWIDTH SAW FILTER

TECHNICAL FIELD

This invention relates generally to Surface Acoustic Wave (SAW) structures and more particularly to a SAW filter structure having multiple bandwidths.

BACKGROUND

SAW components use acoustic waves which travel at the speed of sound. The SAW components are preferred over widely used transmission line components because acoustic waves have a substantially shorter wave length at operating frequency than electromagnetic waves which travel at the speed of light. Therefore, for a given operating frequency, a SAW filter provides a smaller structure than a transmission line structure, therefore, making them suitable for miniaturized radio frequency applications. Furthermore, SAW structures are easily integratable with other active circuits, such as amplifiers and mixers, which are produced using conventional integrated circuit technologies. For the above reasons, the popularity of SAW structures in radio frequency applications, especially in filter applications, has been increasing steadily.

SAW filters are particularly used in communication devices to provide selectivity at various stages of a receiver, such as at the front-end stage or at the IF stage of the receiver. The selectivity of a SAW filter is determined by its bandwidth which is defined as the frequency spectrum limited between the 3 dB points of the filter's frequency response.

When used in the IF stage of the receiver, the bandwidth of the IF SAW filter is dependent upon the type of modulation used in the receiver. With recent developments in telecommunication technology, particularly with the advent of the personal communication systems, such as cordless telephone second-generation also known as CT2, European and Japanese digital cordless telephone systems, respectively known as DECT and JDCT, more complex modulation techniques are used for communicating messages. These new digital services require wider bandwidths than usually used on conventional communication systems. For example, the CT2 system uses time division duplex (TDD) with frequency division multiple access (FDMA) technology which supports digital data rate of 72 kilobits per second per channel with a 32 kilobits per second adaptive differential pulse code modulated (ADPCM) voice signal. The CT2 system requires a 100 KHz IF bandwidth for communicating messages. On the other hand, the European digital cordless telephone system (DECT) utilize a time division multiple access (TDMA) system supporting digital data at 1152 kilobits per second per channel which uses a 32 kilobits per second ADPCM voice signal. The DECT requires approximately 1200 KHz of IF bandwidth, whereas, the Japanese digital cordless telephone system (JDCT) uses QPSK modulation at 384 kilobits per second per channel with 32 kilobits per second ADCPM voice which requires an IF bandwidth of 240 KHz. In the United States of America, several systems with different modulation and IF bandwidth requirements are under consideration. The modulations under consideration are GFSK or QPSK with IF bandwidths of approximately 400-500 KHz.

It is desirable to provide a universal IF circuit which is capable of servicing different modulation techniques and accommodate their bandwidth requirements accordingly. A universal IF circuit, in addition to providing a more flexible radio receiver, reduces design and manufacturing costs as well. However, conventional SAW filter designs provide a fixed bandwidth and are not suitable for applications requiring multiple bandwidths. Therefore, there exists a need for a multi-bandwidth SAW filter which may, for example, be used in a radio capable of operating in communication systems having different modulation requirements.

SUMMARY OF THE INVENTION

Briefly, according to the invention, a multi-bandwidth SAW filter includes a plurality of SAW transducers disposed on a piezoelectric substrate. The SAW transducers have different lengths corresponding to selectable bandwidths of the SAW filter. The SAW filter is responsive to a control signal for presenting an input signal to one of the selected SAW transducers.

BRIEF DESCRIPTION OF THE DRAWINGS

FIG. 4 illustrates a third embodiment of the multi-bandwidth SAW filter of FIG. 1.

FIG. 5 illustrates a fourth embodiment of the multi-bandwidth SAW filter of FIG. 1.

DETAILED DESCRIPTION OF THE PREFERRED EMBODIMENTS

Figure 1:
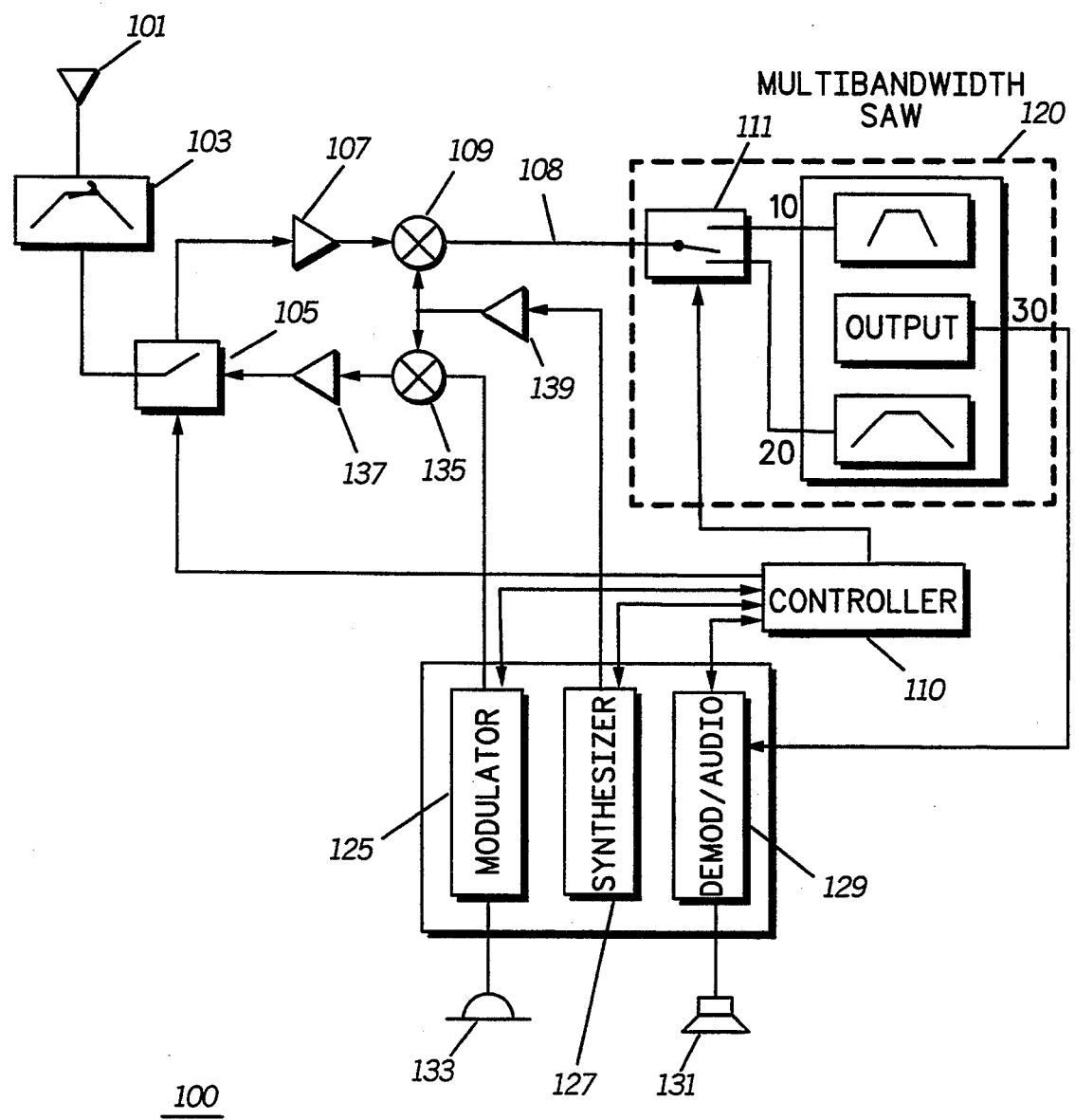
FIG. 1 illustrates a block diagram of a radio utilizing the multi-bandwidth SAW filter of the present invention.

A description of the invention is now presented and is best understood from a consideration of the following text in conjunction with the drawing figures, in which like reference numerals are carried forward.

Referring to FIG. 1, a block diagram of a radio 100 which incorporates a multi-bandwidth filter, according to the principles of the present invention, is shown. The radio 100 is a two-way communication unit which is capable of operating in receive and transmit modes. The radio 100 is a microprocessor controlled communication unit comprising a controller 110 which controls its overall operation. In the receive mode, a communicative signal is received by an antenna 101 which applies it to a filter 103 for initial selectivity at the receiver front end. The received signal is passed through an antenna switch 105 which under the control of the controller 110 applies it to a preamplifier stage 107. The preamplifier stage 107 amplifies the received signal and applies it to a mixer 109. The mixer 109 receives a local oscillator (LO) signal generated by a synthesizer 127 through a LO amplifier 139 to provide an IF signal 108. As is well known under the control of the controller 110, the synthesizer 127 generates proper local oscillator frequency to tune the radio to receive the communication signals at a predetermined carrier frequency.

The IF signal 108 is applied to an IF filter stage comprising multi-bandwidth SAW filter 120 of the present invention. The IF stage is responsive to a control signal generated by the controller 110 for presenting, based on a predetermined criteria, a proper bandwidth to the IF signal 108. Therefore, the IF signal may be selectively switched between ports 10 and 20 which present different bandwidths to the IF signal 108. The out of the IF stage is provided at a port 30. The proper bandwidth may be presented based on the type of modulation technique used by the communication system in which the radio 100 operates. Such bandwidth information may be pre-stored in the controller 110 to select a particular IF bandwidth commensurate with the modulation technique offered by the communication system. Alternatively, the modulation information may be modifiably stored in the controller 110 for accommodating situations in which the radio 100 operates in more than one communication system offering different modulation techniques. In this way, the radio 100 may determine the type of modulation used in the particular communication system and cause the controller 110 to generate corresponding control signal for presenting the proper IF bandwidth. For example, if the communication unit 100 operates in a DECT cordless telephone system, the control signal generated by the controller 110 causes the multi-bandwidth SAW filter 120 to present a 1200 KHz IF bandwidth to the IF signal 108. On the other hand, if the radio 100 operates in a JDCT system, the control signal generated by the controller causes the multi-bandwidth filter 120 to present a 240 KHz bandwidth. In this way, the IF signal 108 is appropriately filtered by the multi-bandwidth SAW filter 120 as specified by the control signal.

The output of the multi-bandwidth SAW filter 120 is applied to a well known demodulator/audio stage 129 which also operates under the control of the controller 110. The modulator/audio stage 129 may be arranged using well known software or hardware controlled schemes to provide more than one demodulation technique. In this way, the controller 110 may also specify, again, based on the modulation offered by the communication system, the type of demodulation technique needed for recovering the received message. The output of the demodulator/audio stage 129 is applied to a speaker 131 to render the transmitted messages audible.

In transmit mode, a communicated message as inputted through a microphone 133 is applied to a modulator 125 which operates under the control of the controller 110. The controller 110 may also specify to the modulator what type of modulation technique is desired according to the communication system in use. The output of the modulator is applied to a transmitter IF mixer 135 which receives a transmitter local oscillator signal from the synthesizer 127. The output of the transmitter IF mixer 135 is amplified by an amplifier 137. The communication messages from the communication unit 100 are radiated through the antenna 101 after being applied to the antenna switch 105 and the filter 103.

Having described the operation of the radio 100, different structural embodiments of the multi-bandwidth SAW filter, according to the present invention, will be described now. As is well known, SAW filters utilize piezoelectric materials to achieve conversion of electrical energy to acoustic energy and vice-versa. The piezoelectric material may comprise quartz, lithium niobate, and lithium tantalate which are formed as substrates upon which acoustic transducer structures are disposed for achieving the required acousto-electric and electro-acoustic energy conversion. Because the bandwidth of an acoustic wave transducer is inversely proportional to its length, the applicants of the present invention contemplate providing a mechanism whereby an input signal is presented to one or more transducers with length corresponding to the bandwidth requirements of the SAW filter.

Figure 2:
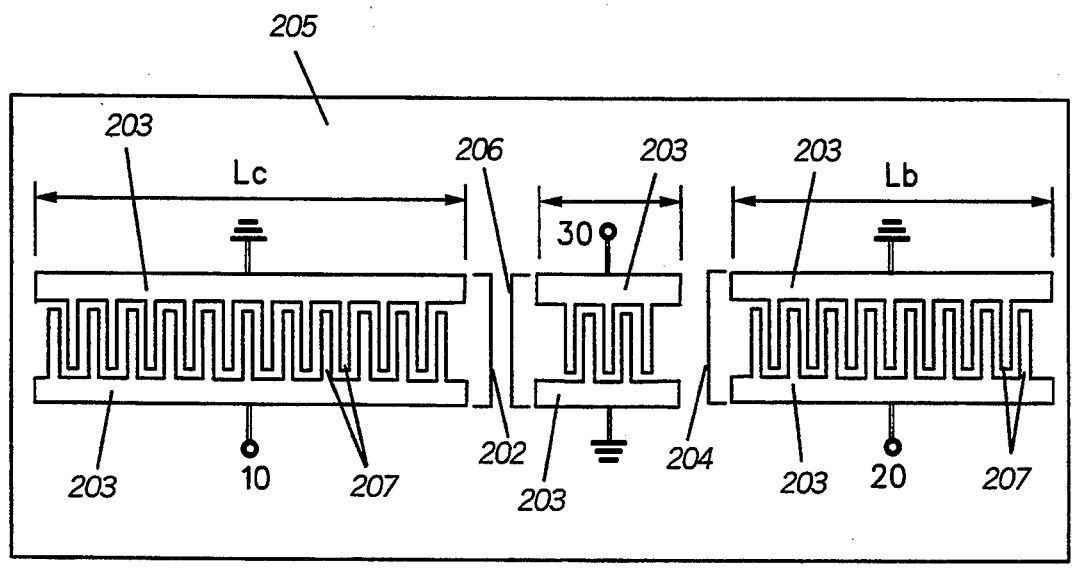
FIG. 2 illustrates a first embodiment of the multi-bandwidth SAW filter of FIG. 1.

Referring to FIG. 2, a structural diagram of a multi-bandwidth SAW filter 200 capable of presenting two distinct and selectable bandwidths is shown. Structurally, the filter 200 is comprised of a piezoelectric substrate 205 upon which conductive patterns forming a first input transducer 202, a second input transducer 204, and an output transducer 206 are disposed. The conductive patterns may be disposed on the piezoelectric substrate 205 utilizing any number of techniques such as thin-film or thick-film processes. The transducers are acoustically coupled by positioning the output transducer 206 between the input transducers 202 and 204. Thus, the output transducer 206 receives, at its opposing sides, acoustic waves propagated from the input transducers 202 and 204. The transducers 202, 204 and 206 are each patterned to include pairs of electrodes 203 having the interdigitated fingers 207 as illustrated. Each electrode pair includes a first grounded electrode and a second non-grounded electrode which provides the input or output ports 10, 20 and 30 of the transducers 202, 204 and 206. The properties of the piezoelectric material, as well as the spacing between the interdigitated fingers 203, determine the frequency response of the SAW filter.

According to the invention, the input transducers 202 and 204 have different lengths which corresponds to the different bandwidths of the multi-bandwidth SAW filter 200. As shown, the input transducer 202 has a length $L_c$ and the input transducer 204 has a length $L_b$ which is shorter than the length Lc. Because the length of acoustic transducers are inversely proportional to their bandwidth, the shorter transducer 204 provides a wider bandwidth than the longer transducer 202. The SAW filter 200 is capable of receiving input signals at input ports 10 and 20 to provide an output signal at output port 30. Therefore, if a narrow bandwidth is desired an input signal may be applied to the input port 10, and if a wide bandwidth is desired the input signal is applied to the input port 20. For example, in the radio receiver application described in conjunction with FIG. 1, the IF signal 108 may be switched between the input ports 10 and 20 based on the bandwidth requirement of the modulation technique. Thus, the multiple bandwidths of the filter 200 are provided by selecting different lengths for the input transducer 202 and 204. Therefore, dependent upon which port the input signal is applied to, the SAW transducer 200 provides a bandwidth commensurate with the length of the input transducer.

It may be appreciated by one of ordinary skill in the art that the terms "input transducers" and "output transducers" as referred to herein may be used interchangeably because multi-port SAW transducers are bidirectional devices capable of interchangeably receiving input and output signals at their port terminations to provide a frequency response commensurate with their geometry. That is, a port referred to as an input port may also be used as an output port and vice versa. Therefore, an input signal may be applied to port 30 of FIG. 2 to provide output signals at ports 10 and 20 with bandwidth characteristics corresponding to the length of their respective SAW transducer. Thus, the SAW transducer 206 may be used as an input transducer, whereas the SAW transducers 202 and 204 may be used as output transducers. For simplicity of understanding the applicants have made references to "input transducer" and "output transducer" throughout the remainder of the specification. However, it should be noted that the input and output transducers are interchangeable and the true spirit of the invention is not limited by such references.

Figure 3:
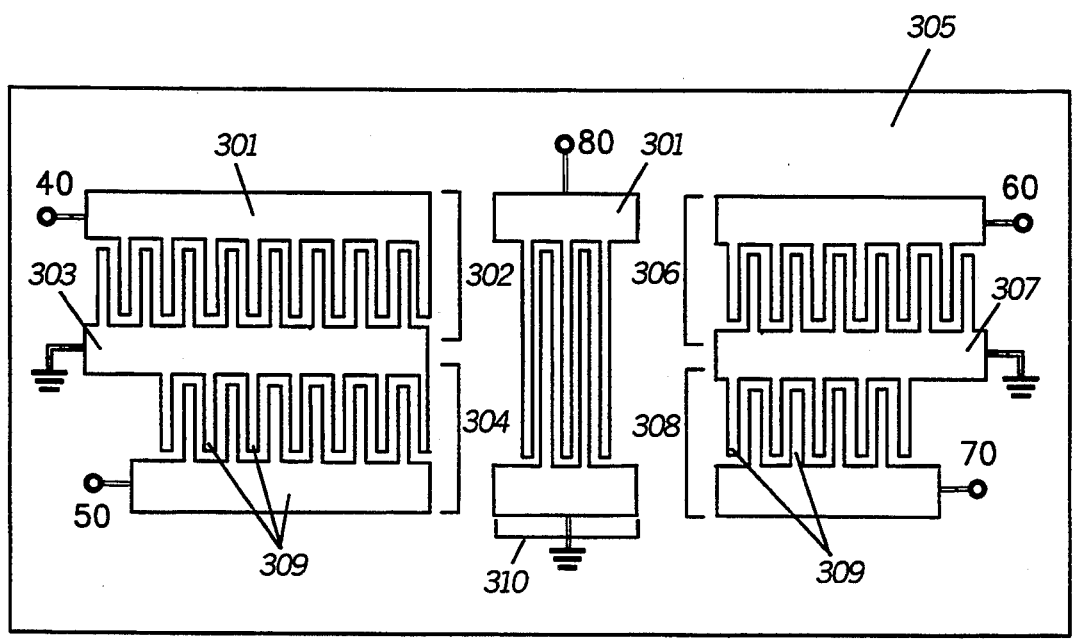
FIG. 3 illustrates a second embodiment of the multi-bandwidth SAW filter of FIG. 1.

Referring to FIG. 3, another embodiment of multi-bandwidth SAW filter 300 of present invention is shown. The multi-bandwidth SAW filter 300 includes four input transducers 302, 304, 306 and 308 and an output transducer 310 making it capable of presenting four distinct and selectable bandwidths. The four input transducers 302, 304, 306 and 308 and the output transducer 310 comprise conductive patterns forming electrodes with interdigitated fingers 309. As before, the conductive patterns are disposed on a piezoelectric substrate 305. In this embodiment, the input transducers 302 and 304 are paired together by means of opposing electrodes which share a common grounded track 303. As such, the fingers of the opposing electrodes extend from the opposing sides of the common track 303. Similarly, the input transducers 306 and 308 are paired together through opposing electrodes which share a common grounded track 307. The input transducers 302, 304, 306 and 308 respectively receive signals at input ports 40, 50, 60 and 70. The output transducer 310, which is positioned between the input transducer pairs 302–304 and 306–308 provides an output signal at an output port 80. Again, according to the invention, the length of the input transducers 302, 304, 306 and 308 are different from each other and correspond to the selectable bandwidth of the filter 300. Under this arrangement, an input signal, such as the IF signal 108 of FIG. 1, may be presented to differing bandwidths by selectively applying it to the input ports 40, 50, 60, or 70. The input signal may be applied to a selected one of the input ports by means of well-known control circuits which are responsive to a control signal corresponding to a desired bandwidth.

Referring now to FIG. 4, another embodiment of a multi-bandwidth filter 400 is shown. The filter 400 is comprised of a piezoelectric substrate 405 upon which conductive patterns 407, 422, 426, 428, and 431 having interdigitated fingers 403 are disposed. These conductive patterns form a variable length input transducer 402 and an output transducer 420. In this embodiment the input transducer 402 is comprised of a plurality of sequentially positioned sub-transducers 412, 414, 416 and 418, having lengths La, Lb, Lc and Ld, respectively. The input transducer 402 includes a single conductive pattern 407 which serially integrates grounded electrodes of the sub-transducers 412, 414, 416 and 418. The conductive pattern 407 comprises a common track 409 from one side of which extend the fingers of the grounded electrodes of the sub-transducers 412, 414, 416, and 418. Also disposed on the substrate 405 are a number of conductive patterns 422, 424, 426 and 428 having finger arrangements which are interdigitated with the fingers of the single conductive pattern 407 forming the SAW sub-transducers 422, 424, 426 and 428. The SAW filter 400 also includes a control circuit 430 which, in response to binary control signals 432, is capable of closing or opening a plurality of serially coupled relay switches a, b and c. The relay switches a, b, and c are positioned between an input port 90 which receives an input signal, such as the IF signal 108 of FIG. 1, and the SAW sub-transducers 422, 423, 426 and 428. In response to the control signal 432 which may be a binary signal representing a predetermined condition, such as bandwidth requirements of the filter, the switches a, b and c may be selectively closed or opened to present a variable length input transducer to the input signal. The terminals of the switches a, b and c are connected to the input sub-transducers 412, 414, 416, and 418 such that the length of the input transducer 402 is increased by sequential closing of the switches a, b, and c. Conversely, the length of the input transducer 402 is decreased by sequential opening of the switches a, b, and c. As shown, one terminal of switch c is connected to the electrode 428, the common terminals of switches b and c are connected to electrode 426, the common terminals of switches a and b are connected to electrode 424, and the other terminal of switch a is connected both to the electrode 422 and the input port 90. It can be appreciated that by sequentially switching switches a, b and c, the length of the input transducer of the filter 400 may be varied. If, for example, all the switches are open, the input signal is presented only to the sub-transducer 412 the sole length, La, of which sets the bandwidth of the filter 400. If the switch a is closed and the remaining switches, i.e., switches b and c, are kept open the input transducer comprises the combination of the sub-transducers 412 and 414 having a length equal to $L_a+L_b$. However, if switches a and b are closed, the input signal is applied to an input transducer comprising sub-transducers 412, 414 and 416 having a length equal to $L_a+L_b+L_c$. And, if all switches are closed, the input signal is applied to an input transducer having a length equal to $L_a+L_b+L_c+L_d$ and comprising sub-transducers 412, 414, 416 and 418. Therefore, depending on which switches are closed and which are opened, the input signal at port 90 may be presented to a variable length input transducer 402 comprising one or more of the sub-transducers 412, 414, 416 and 418. Thus, in this arrangement, a SAW filter is provided which has multiple bandwidths which includes means for selectively varying the length of the input transducer in response to a control signal.

It may be appreciated by one of ordinary skill in the art that the control circuit 430 and the switches a, b, c, may be disposed on the piezoelectric substrate 405 utilizing conventional integrated circuit technologies to provide an integrated multi-bandwidth SAW filter package.

Referring to FIG. 5, a diagram of a multiple bandwidth SAW filter 500 is shown which has a parallel switch arrangement as opposed to the serial switch arrangement for FIG. 4. The filter 500 includes conductive patterns disposed on a piezoelectric substrate 505 forming an input transducer comprising a plurality of SAW sub-transducers 512, 514, 516, 518, and 520 and an output transducer 522. A plurality of parallel coupled relay switches a′, b′, c′, d′ and e′ which are responsive to a control signal 532, are coupled between an input port 95 and the SAW sub-transducers 512, 514, 516, 518, and 520 for presenting the input signal to a selected one of the SAW transducers having a length corresponding to the desired bandwidth. A control circuit 530 in response to the control signal 532 controls the switches a′, b′, c′, d′ and e′. When the control circuit 530 closes any of the switches in response to the control signal 532, the input signal is presented to one or more of the appropriately lengthed input sub-transducer 512, 514, 516, 518 or 520.

Figure 6:
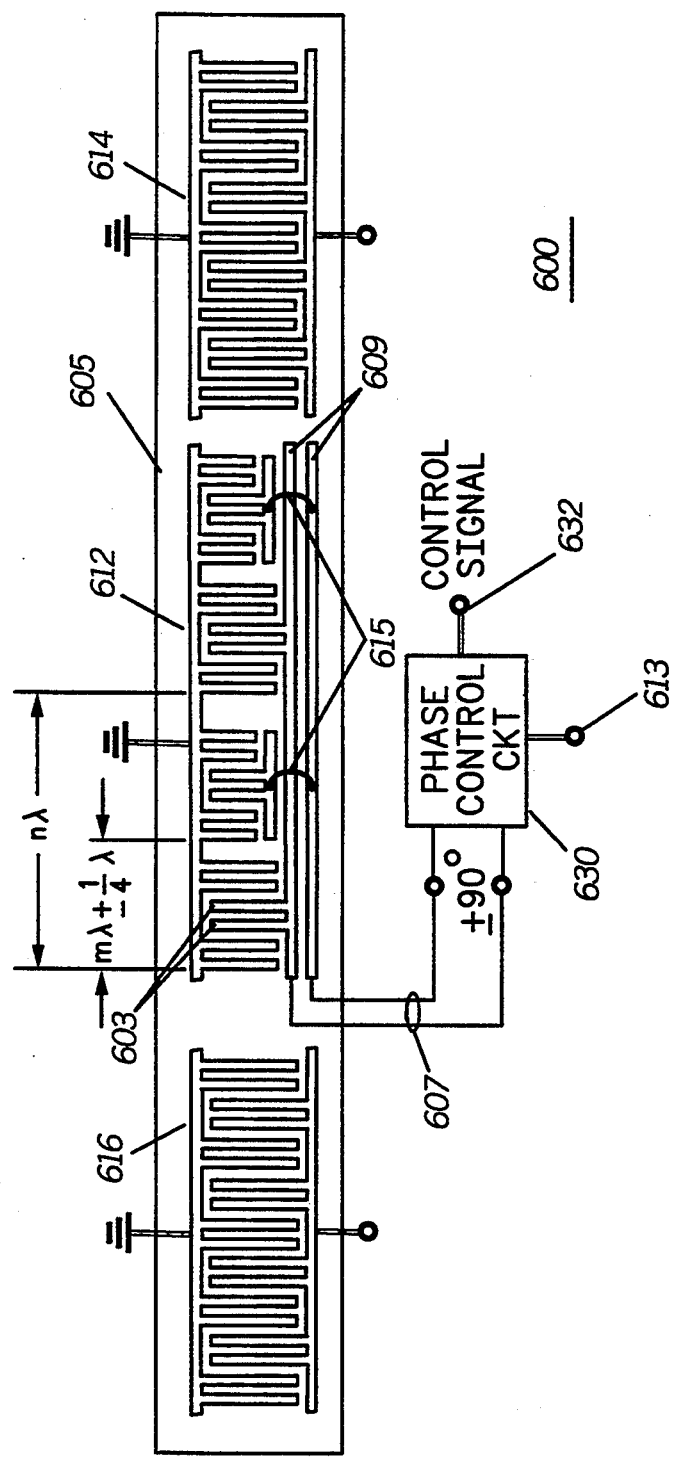
FIG. 6 illustrates a fifth embodiment of the multi-bandwidth SAW filter of FIG. 1.

Referring to FIG. 6, a multi-bandwidth SAW filter 600 is shown which provides multiple bandwidth by selectively controlling the direction of acoustic waves and then applying through SAW transducers with lengths corresponding to a desired bandwidth. The SAW filter 600 includes a SAW center transducer 612 which is positioned between two SAW transducers 616 and 614, the transducers being disposed on a piezoelectric substrate 605. As such, the SAW transducers 616 and 614 are positioned on the opposing sides of the center SAW transducer 612. The SAW transducers 614 and 616 have lengths corresponding to selectable bandwidths of the filter 600.

The center transducer 612 comprises a multi-phase unidirectional transducer which is capable of selectively directing acoustic waves to travel through one or the other of its opposing sides in response to a particular phase difference between a pair of phase differentiated signals 607. If for example, the phase difference between the phase differentiated signals is +90 degrees, the acoustic waves could, bidirectionally, travel within the right side of the center SAW transducer 612 with no acoustic wave propagating from the left side. Conversely, if the phase difference is −90 degrees the acoustic waves propagate through the left side with none propagating through the right side. The phase differentiated signals 607 are provided by applying an input signal at port 613 to a phase control circuit 630 which is responsive to a control signal 632 for setting the phase difference. In the preferred embodiment, the phase difference may be selectively set to +90 and −90 degrees based on a selectable bandwidth of the SAW filter 600. The phase differentiated signals 607 are applied to a pair of parallel tracks 609 one of which is positioned farther below the center SAW transducer 612. The multi-phase unidirectional transducers are well known and consist of groups of interdigitated fingers 603 which are offset from each other by integral number (n and m) of wave-lengths plus or minus one quarter wave length. Certain interdigitated fingers at predetermined positions along the center SAW transducer 612 are coupled to the farther one of the tracks 609 by jumpers 615, thereby creating the selectively unidirectional characteristic of the center SAW transducer 612. As such, an input signal which is selectively split into plus (+) or (−) 90 degrees phase differentiated signals is applied to the unidirectional SAW transducer 612. Within the SAW transducer 612, depending on the phase difference, the phase differentiated signals will combine constructively in one direction and destructively in the other direction. Thus, the transducer will convert the electrical input signal to an equivalent acoustic signal in a unidirectional manner. The propagation direction (i.e., left-side or right-side) will depend on the phase difference of the phase differentiated signals 607.

According to this embodiment of the invention, the bandwidth of the SAW filter is selected by selecting propagation direction of the acoustic waves within the center SAXV transducer 612. If left-side propagation direction is selected, the SAXV filter 600 provides a bandwidth which corresponds to the length of the SAW transducer 616. If however, a right-side propagation direction is selected, the SAW bandwidth of the SAW filter 600 is determined by the length of the SAW transducer 614.

As described above, the various embodiments of the present invention provide a filter which takes advantage of small size and integratability of SAW structures while providing capability for providing selectable bandwidths which facilitate multi-system operation as well as manufacturing of communication devices with various bandwidth requirements.

We claim:

1. A multi-bandwidth SAW filter, comprising:
   a piezoelectric substrate;
   first and second SAW transducers having different lengths disposed on said piezoelectric substrate, wherein the lengths of said SAW transducers correspond to selectable bandwidths of the filter;
   a third SAW transducer positioned between the first and second SAW transducers, wherein the third SAW transducer comprises a unidirectional SAW transducer capable of selectively directing acoustic waves to and from one of its opposing sides; and
   means for selecting one of said first and second SAW transducers in response to a control signal, and for coupling an input signal to the selected SAW transducer, the control signal indicating a desired bandwidth for the SAW filter to present.

2. The SAW filter of claim 1, wherein said unidirectional SAW transducer comprises a multi-phase unidirectional SAW transducer being responsive to a phase difference for selecting the direction of the acoustic waves.

3. The SAW filter of claim 2, further including a phase splitting means coupled to the multi-phase unidirectional SAW transducer, said phase splitting means being responsive to a control signal corresponding to a selectable bandwidth of the SAW filter for providing the phase difference.

4. A radio, comprising:
   receiver means for receiving an input signal, the receiver means comprising:
   a multi-bandwidth SAW filter, comprising:
      a piezoelectric substrate;
      first and second SAW transducers having different lengths disposed on said piezoelectric substrate, wherein the lengths of said SAW transducers correspond to selectable bandwidths of the filter;
      a third SAW transducer positioned between the first and second SAW transducers, wherein the third SAW transducer comprises a unidirectional SAW transducer capable of selectively directing acoustic waves to and from one of its opposing sides; and
      means for selecting one of said first and second SAW transducers in response to a control signal, and for coupling an input signal to the selected SAW transducers, the control signal indicating a desired bandwidth for the SAW filter to present.

5. The radio of claim 4, wherein said unidirectional SAW transducer comprises a multi-phase unidirectional SAW transducer being responsive to a phase difference of acoustic waves for selecting the direction of the acoustic waves.

6. The radio of claim 5 further including a phase splitting means coupled to the multi-phase unidirectional SAW transducer, said phase splitting means being responsive to a control signal corresponding to a selectable bandwidth of the SAW filter for providing the phase difference.

7. A SAW filter for presenting selectable bandwidths to an input signal, comprising:
   a piezoelectric substrate;
   at least one SAW transducer having a selectable length disposed on said piezoelectric substrate, said SAW transducer comprising a plurality of sequentially positioned SAW sub-transducers having selectable lengths corresponding to a selectable bandwidth of the SAW filter; and sequential coupling means for sequentially coupling two or more of said sub-transducers to each other in series, said sequential coupling means being responsive to a control signal corresponding to the selectable bandwidths of the SAW filter, wherein said means for sequentially coupling the SAW sub-transducers includes a plurality of serially coupled switches positioned between the input signal and the plurality of the SAW sub-transducers.

* * * * *